United States Patent
Smola (10) Patent No.: US 11,470,702 B2
(45) Date of Patent: Oct. 11, 2022

(54) SYSTEM, AND METHOD FOR DETERMINING A HEALTH STATUS OF A DIMMABLE PULSED LED LIGHT STRING

(71) Applicant: SIGNIFY HOLDING B.V., Eindhoven (NL)

(72) Inventor: Paul Smola, Bedford, NH (US)

(73) Assignee: SIGNIFY HOLDING B.V., Eindhoven (NL)

(*) Notice: Subject to any disclaimer, the term of this patent is extended or adjusted under 35 U.S.C. 154(b) by 406 days.

(21) Appl. No.: 16/479,627

(22) PCT Filed: Jan. 23, 2018

(86) PCT No.: PCT/EP2018/051497
§ 371 (c)(1),
(2) Date: Jul. 22, 2019

(87) PCT Pub. No.: WO2018/134422
PCT Pub. Date: Jul. 26, 2018

(65) Prior Publication Data
US 2021/0337643 A1 Oct. 28, 2021

Related U.S. Application Data

(60) Provisional application No. 62/449,559, filed on Jan. 23, 2017.

(30) Foreign Application Priority Data
Feb. 7, 2017 (EP) ..................................... 17154914

(51) Int. Cl.
H05B 45/50 (2022.01)
H05B 45/14 (2020.01)
(Continued)

(52) U.S. Cl.
CPC ............. *H05B 45/50* (2020.01); *H05B 45/14* (2020.01); *H05B 45/32* (2020.01); *H05B 45/58* (2020.01); *H05B 45/54* (2020.01)

(58) Field of Classification Search
None
See application file for complete search history.

(56) References Cited

U.S. PATENT DOCUMENTS

2004/0196049 A1  10/2004  Yano et al.
2008/0094349 A1  4/2008  Liao et al.
(Continued)

FOREIGN PATENT DOCUMENTS

CN   101662867 A   3/2010
CN   102473798 A   5/2012
(Continued)

*Primary Examiner* — Jany Richardson
(74) *Attorney, Agent, or Firm* — Daniel J. Piotrowski (57) ABSTRACT

A system and method to determine a health status of a LED light string. The system (100) includes a circuit that includes a LED light string (110) and a pulsed current driver (115) of the LED light string. The circuit is connected to a power source (105). The system includes a current sensor (120) measuring a current through the circuit. The system includes a detecting device (130) determining a state of the circuit. The detecting device determines an expected current expected to be passing through the circuit where the expected current is associated with the state. The detecting device receives a current measurement from the current sensor during a time when the circuit is in the state. The detecting device determines a comparison between the current measurement and the expected current. The detecting device generates an output indicative of a health status of the circuit based on the comparison.

13 Claims, 3 Drawing Sheets

(51) Int. Cl.
*H05B 45/58* (2020.01)
*H05B 45/32* (2020.01)
*H05B 45/54* (2020.01)

(56) References Cited

U.S. PATENT DOCUMENTS

| | | |
|---|---|---|
| 2011/0234105 A1 | 9/2011 | Castiglia et al. |
| 2011/0309759 A1 | 12/2011 | Shteynberg et al. |
| 2014/0015665 A1* | 1/2014 | Yamaguchi ............ H05B 45/52 340/475 |
| 2014/0152180 A1 | 6/2014 | Wolf et al. |
| 2015/0015143 A1 | 1/2015 | Inada |
| 2015/0327350 A1 | 1/2015 | Van Der Brug |

FOREIGN PATENT DOCUMENTS

| | | |
|---|---|---|
| CN | 105939551 A | 9/2016 |
| DE | 102004025909 A1 | 12/2005 |
| EP | 1750486 A1 | 2/2007 |
| EP | 2744304 A2 | 6/2014 |
| GB | 2135540 A | 8/1984 |
| JP | H03110797 A | 5/1991 |
| JP | 2006276343 A | 10/2006 |
| JP | 2011044367 A | 3/2011 |
| JP | 2012059839 A | 3/2012 |
| JP | 2015079566 A | 4/2015 |
| JP | 2016012471 A | 1/2016 |
| JP | 2016162598 A | 9/2016 |
| WO | 02/067637 A1 | 8/2002 |
| WO | 2013014580 A | 1/2013 |

* cited by examiner

FIG. 3

SYSTEM, AND METHOD FOR DETERMINING A HEALTH STATUS OF A DIMMABLE PULSED LED LIGHT STRING

CROSS-REFERENCE TO PRIOR APPLICATIONS

This application is the U.S. National Phase application under 35 U.S.C. § 371 of International Application No. PCT/EP2018/051497, filed on Jan. 23, 2018, which claims the benefit of U.S. Provisional Patent Application No. 62/449,559, filed Jan. 23, 2017 and European Patent Application No. 17154914.0, filed on Feb. 7, 2017. These applications are hereby incorporated by reference herein.

BACKGROUND INFORMATION

A lighting arrangement may include an array of one or more light strings. Each light string may include one or more lights such as light emitting diodes (LEDs). The array of light strings may be arranged in predetermined manners such that a specific shape or design may be achieved. Thus, when a current is passed through the light strings, each light of the light string is powered to be illuminated. The light string may also be dimmable. That is, the lighting arrangement may utilize a controller that controls the manner in which current is supplied to the light string such that the light string is powered to be fully illuminated, partially illuminated, or not illuminated. In this manner, the shape or design of the array of light strings may be dynamic, such as a sequence of designs imitating movement may be shown.

The lighting arrangement may be configured with a health indicator to automatically identify when any of the lights strings is not operating or is operating at an undesired level. As those skilled in the art will understand, when even one light in a single light string is not operating as intended, the entire design may not appear as desired. With light strings that are constantly illuminated, the health indicator may utilize a simple determination in which parameters associated with the light string being constantly illuminated are observed. When one of the parameters are not registering an expected value, the health indicator may generate an alert.

Many lighting systems pulse LEDs on and off, by applying power periodically or intermittently. So long as the flicker rate is greater than the human flicker fusion threshold, and the LED is stationary relative to the eye, the LED will appear to be continuously lit. Varying the on/off ratio of the pulses is known as pulse-width modulation.

Pulse-width modulation (PWM) has been adopted as the preferred dimming technique for high-quality LED lighting. PWM is the process of modulating the duty cycle of a signal, used to control the average power sent to each LED. During the ON cycle of the PWM train, the LED is powered at the recommended forward voltage/forward current operating point—ensuring that the correlated color temperature (CCT) is within the predetermined parameters. The duty cycle (ratio of the pulse duration to the signal period of the PWM train then determines the average current and therefore the perceived luminosity. For example, during a 10% duty cycle, the signal is at the logic high level or "ON" state for only a brief time each cycle, but with 90% duty cycle, most of the signal's period is spent at logic high level or "ON" state. If the frequency of the signal is fast enough, then there will be no visible flicker, and the LED's brightness will be proportional to the signal's duty cycle.

However, with dimmable light strings that employ pulsed LEDs having a dynamic current draw, the health indicator cannot utilize the simple determination operation as when the light string is constantly illuminated. In existing systems, sensing circuitry is very sensitive to spurious variations in design currents. Thus, the health indicator may output incorrect values for the health of a light string such as a false positive or a false negative.

SUMMARY

The exemplary embodiments are directed to a system, comprising: a circuit including an LED light string and a pulsed current driver of the light string, the circuit connected to a power source; a current sensor measuring a current through the circuit; and a detecting device determining an ON or OFF pulsed current state of the circuit, the detecting device determining an expected current expected to be passing through the circuit, the expected current associated with the ON or OFF pulsed current state, the detecting device receiving a current measurement from the pulsed current sensor during a time when the circuit is in the ON or OFF pulsed current state, the detecting device determining a comparison between the current measurement and the expected current when the circuit is in an ON pulsed current state, the detecting device generating an output indicative of a health status of the circuit based on the comparison.

The invention eliminates ambiguity in the health status or a binary health indicator and provides an accurate determination that the LED string or pulsed current driver has encountered some type of full or partial failure, and is no longer providing the illumination levels requested by the lighting controller. It does this by directly sensing the current through the LED drive circuit, but only after insuring that the LEDs in the string has been controlled by the system to be in the ON pulsed current state and should be conducting current at the time when the measurement is taken.

The exemplary embodiments are directed to a device, comprising: a comparator receiving a first signal and a second signal, the first signal indicative of a current measurement through a circuit, the second signal indicative of an expected current to be passing through the circuit at a time the current measurement is taken, the comparator determining a comparison between the first signal and the second signal, the comparator generating an output based on the comparison; and a latch receiving the second signal and being in a first state, the latch further receiving the output, wherein the latch changes from the first state to a second state when the output indicates a disparity between the first signal and the second signal.

The exemplary embodiments are directed to a method, comprising: determining a state of a circuit including an LED light string and a pulsed current driver of the LED light string; determining an expected current expected to be passing through the circuit, the expected current associated with the ON or OFF pulsed current state; measuring a current through the circuit during a time when the circuit is in the ON or OFF pulsed current state; determining a comparison between the current and the expected current when the circuit is in an ON pulsed current state; and generating an output indicative of a health status of the circuit based on the comparison.

DETAILED DESCRIPTION

The exemplary embodiments may be further understood with reference to the following description and the related appended drawings, wherein like elements are provided with the same reference numerals. The exemplary embodiments are related to a device, a system, and a method for determining a health status of a dimmable LED light string (hereinafter, light string). The dimmable light string may be powered dynamically with different amounts of current for illumination at different times and/or at different intensities such that a current that is sensed by a monitoring or detecting device that is monitoring the light string may also be dynamic. The exemplary embodiments provide a mechanism that provides an accurate determination of a full or partial failure of the light string or pulsed driver of the light string is identified. As will be described in further detail below, the mechanism of the exemplary embodiments may sense a current through the light string but only after insuring that the light string is in a specific state (e.g., ON or OFF pulsed current state or illumination intensity).

In determining a health status of dimmable light strings, the timing of measuring factors such as a current is crucial to properly identify whether the light string and/or a driver controlling the light string is functioning at expected or predetermined levels. For example, when the current is measured at a time when the light string is dimmed but the reference current by which the health status is determined is based on the light string being in an ON pulsed current state or fully illuminated, such a scenario may cause the health indicator to return a poor health for the light string despite the light string functioning properly.

The exemplary embodiments provide a health indicator that accurately determines the health status of a light string and/or the pulsed driver of the light string. As will be described in further detail below, the health status may be a binary, where the output of the health indicator is either a good health indication (e.g., YES) or a poor health indication (e.g., NO). The exemplary embodiments may incorporate features associated with filtering the health indicator to make a highly accurate determination that a light string and/or associated pulsed driver is no longer functioning in accordance with design rules due to any possible number of failures. Specifically, the exemplary embodiments ensure that the light string is in an activated, illuminated state at an expected intensity and is conducting an expected current therethrough. When the light string is in any state, a current measurement may be taken. The current measurement may be compared to a reference current value for the selected state (but in particular, when current should be flowing in the LED light string e.g. in an ON state of an ON/OFF pulse controller of a pulsed current driver) and this may be used by the health indicator according to the exemplary embodiments to generate the appropriate output.

Figure 1:
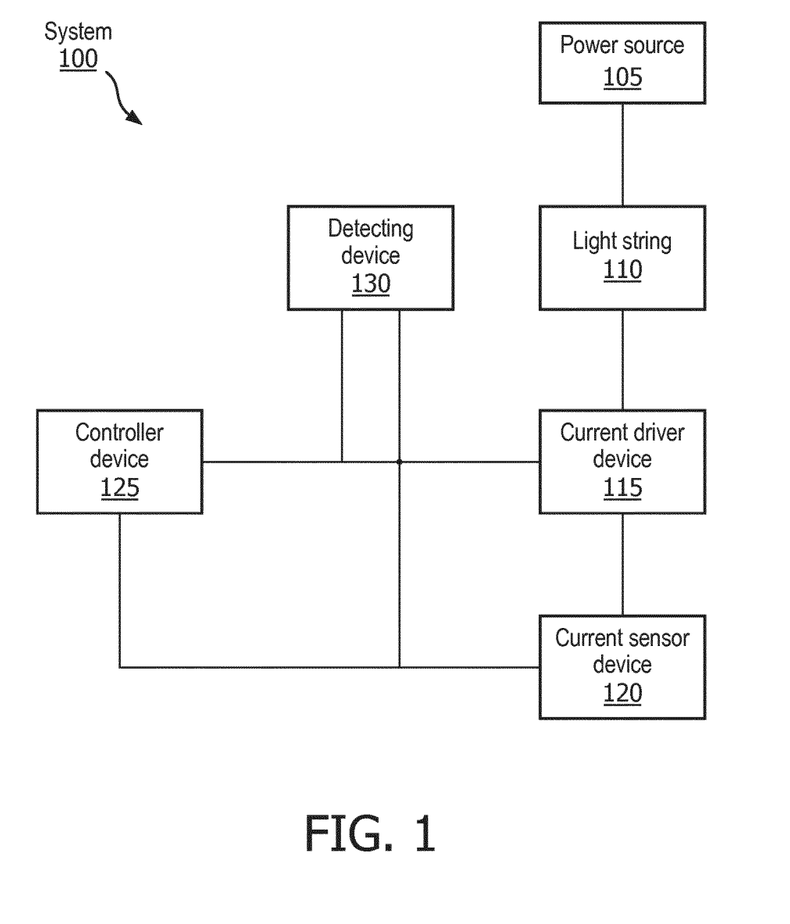
FIG. 1 shows a system according to the exemplary embodiments.

FIG. 1 shows a system 100 according to the exemplary embodiments. The system 100 relates to a lighting arrangement that is used to illuminate one or more designs using dimmable lights. Thus, the system 100 may include a power source 105, a light string 110, a pulsed current driver device 115, and a controller device 125. The system 100 is also capable of determining a health status of the lighting arrangement. Thus, the system 100 may also include a current sensor device 120 and a detecting device 130.

Initially, it is noted that the connections between the components illustrated in the system 100 of FIG. 1 are only exemplary. The system 100 may include further connections between the components or may be arranged in a different manner such that a different set of connections between the components may be utilized. For example, the pulsed current driver device 115 may be positioned between the power source 105 and the light string 110.

The power source 105 may be any source of power that provides the light string 110 with a current. For example, the light string 110 may include an adapter that connects to an outlet of the power source 105. Once connected, the power source 105 may provide current to the light string 110. Specifically, a steady or static rate of current may be provided from the power source 105 as long as the connection is established. In another example, the power source 105 may be a battery or series of batteries that provide the current.

The light string 110 may be any string including one or more lights. When the light string 110 includes more than one light, the lights may be arranged in series. Thus, the lights may be connected to one another such that current provided on a first end of the light string 110 is passed through the entire string to power each of the lights in the light string 110. It should be noted that the arrangement of the lights in series is only exemplary. The exemplary embodiments may also be utilized for a light string 110 that is arranged in parallel. The one or more lights of the light string 110 may also be of any type. For example, the lights may be filament bulbs, light emitting diodes (LEDs), etc.

As noted above, the exemplary embodiments may relate to when the light string 110 is configured to be dimmable. Thus, each of the lights in the light string 110 and the connections between the lights (when more than one light is included in the light string 110) may be configured such that the lights may be fully illuminated, partially illuminated, or unpowered while the light string 110 is connected to the power source 105. Since the power source 105 provides a constant rate of current to the light string 110, the system 100 may utilize components that control how much current is provided to the light string 110 to utilize the dimmable feature.

The pulsed current driver device 115 may be configured to control the current passing through the light string 110 from the power source 105. Specifically, the pulsed current driver device 115 may receive an input indicating the amount of current to be supplied to the light string 110. Based on this input, the pulsed current driver device 115 may utilize an operation or setting such that the indicated current is provided to the light string 110. The pulsed current driver device 115 may continue to provide the indicated current until a further input is received that indicates a different current that is to be supplied to the light string 110.

The controller device 125 may be configured to determine when the light string 110 is to be powered as well as determine the intensity with which the light string 110 is to be illuminated. Accordingly, the controller device 125 may be the component that provides the input signal to the pulsed current driver device 115 to control the amount of current that is to be provided to the light string 110 to achieve the desired intensity. The controller device 125 may be preprogrammed with a schedule of how the intensity of the light string 110 is to be controlled. For example, the schedule may indicate that the light string 110 is to be illuminated with a first intensity (e.g., fully illuminated) for a first time period, then illuminated with a second intensity (e.g., 50% illuminated) for a second time period, unpowered for a third time period, and repeat. It should be noted that this schedule is only exemplary and the controller device 125 may include or receive any schedule. Thus, the controller device 125 may also be configured to receive a user input of a desired schedule.

The current sensor device 120 may be configured to measure the current flowing through the light string 110 and/or output by the pulsed current driver device 115 and/or generated by the power source 105. It is noted that throughout the remainder of this description, the current sensor device 120 will be described as measuring the current of the light string 110, but it should be understood that this measurement may encompass any of the above described measurements. Specifically, the current sensor device 120 may be a component that detects the electrical current (e.g., alternating current or direct current) passing through the light string 110. Those skilled in the art will understand that any type of current sensor may be used such as an in-line current sensor, an inductive type current sensor, etc. The current measurement may relate to the light string 110 itself or to the individual lights of the light string 110. The current sensor device 120 may output a signal corresponding to the measured current. The signal may be an analog voltage, a digital readout, etc. The current sensor device 120 may also be configured to generate a feedback for the controller device 125. Specifically, the current measurement at a particular time may be forwarded to the controller device 125.

The detecting device 130 may be configured to determine the health status of the light string 110 based on inputs received from the current sensor device 120 and the controller device 125. Specifically, the detecting device 130 may receive the current measurement from the current sensor device 120 and the expected intensity of the light string 110 from the controller device 125. It is noted that the expected intensity of the light string 110 received from the controller device 125 may be in any format that corresponds to the intensity. In one example, the format may be the expected current associated with the intensity that is forwarded from the controller device 125 to the detecting device 130. In another example, the controller device 125 via a digital to analog (D/A) output may output an analog voltage that corresponds to the desired intensity. In a further example, the controller device 125 may output a digital output such as a number associated with the desired intensity (e.g., 0, 1, 2, 3, 4, etc.) and the detecting device 130 may have a table that corresponds the number to a current value. Based on these inputs, the detecting device 130 may determine the health status of the light string 110, particularly from a disparity that may exist between the current measurement (based on the signal from the current sensor device 120) and the expected current (based on the signal from the controller device 125).

Figure 2:
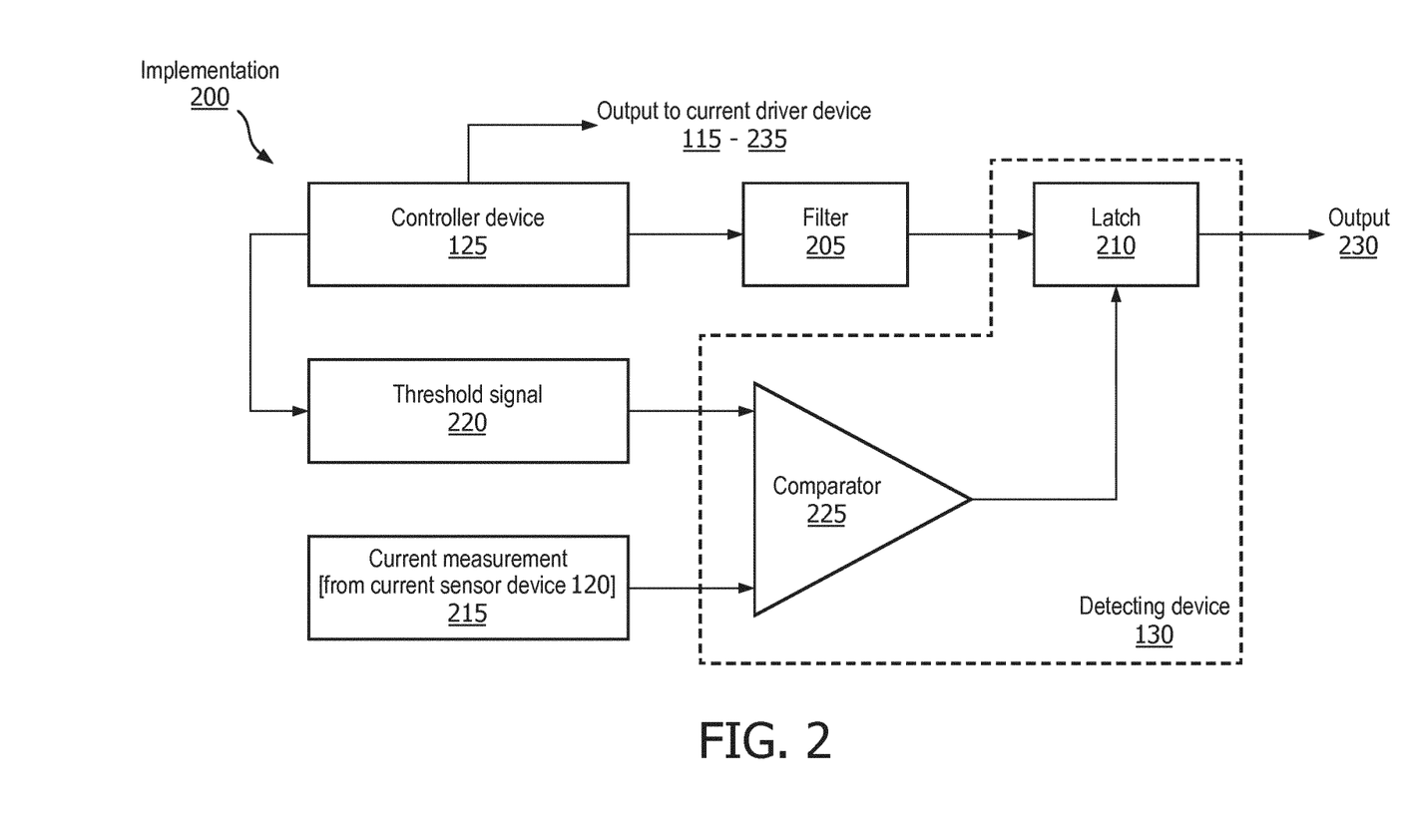
FIG. 2 shows an implementation of the system of FIG. 1 according to the exemplary embodiments.

FIG. 2 shows an implementation 200 of the system 100 of FIG. 1 according to the exemplary embodiments. The implementation 200 relates to an exemplary embodiment in which the system 100 comprises circuitry components. For example, the pulsed current driver device 115, the current sensor device 120, the controller device 125, and the detecting device 130 may each be a circuitry component. Therefore, the implementation 200 of FIG. 2 may represent a schematic of a circuit diagram. The implementation 200 may utilize a selected expected state of the intensity of the light string 110 and an associated expected current that is compared to an actual current measurement to determine the health status of the light string 110 and the pulsed current driver device 115.

The implementation 200 may be any circuitry implementation in which the components are interconnected with one another for signals to be exchanged. These components may be included on one or more integrated circuits, on one or more printed circuit boards, or implemented individually as needed. In this exemplary implementation 200, the controller device 125 may be configured to generate and transmit a signal to the pulsed current driver device 115 based on the schedule (as an output 235), to a filter 205, and as a threshold signal 220. This signal output by the controller device 125 may indicate a current associated with a desired light string 110 intensity and/or the duration for using the intensity. The current sensor device 120 may be configured to measure the current in the light string 110 and generate the current measurement signal (e.g., analog current value). The detecting device 130 may be configured as including a comparator 225 to determine the health status as a binary output and generate a signal corresponding to the binary output. The binary output may be received by a further component such as a further electronic device that interprets the output signal and generates a corresponding display. Thus, in FIG. 2, the detecting device 130 is shown as including the comparator 225 and the latch 210. However, the detecting device 130 may also include additional components that are not illustrated in FIG. 2 or even components that are illustrated in FIG. 2 (e.g., the filter 205). In addition, the latch 210 may be considered a separate component that is not part of the detecting device 130.

As illustrated in FIG. 2, the current measurement 215 is a first signal received from the current sensor device 120 that is a measurement of the current that is being drawn by the light string 110. As described above, the current measurement 215 may be input to the comparator 225 as a voltage. The threshold signal 220 may be a second signal received from the controller device 125 that is the expected current for an expected state of the circuit. For illustrative purposes, the threshold signal 220 corresponds to an expected current and thus a predetermined value. As described above, the threshold signal 220 may be controlled by an adjustable voltage circuit such as a digital to analog (D/A) converter output of the controller device 125 or other microcontroller to allow the threshold signal 220 to be adjustable and be output as a voltage signal. The comparator 225 may then compare the voltage signals corresponding to the current measurement 215 and the threshold signal 220.

The comparator 225 may continuously receive the current measurement 215 from the current sensor device 120. However, it is noted that continuous monitoring of the current through the light string 110 is not a requirement. The controller device 125 may transmit the signal that controls the current through the light string 110 to the pulsed current driver device 115. The signal from the controller device 125 may also be passed through the filter 205 to provide a delay (e.g., low pass filter) to ensure that the remaining operations are performed at the correct time. Specifically, the filter 205 may be disposed on the pathway of the control signal between the controller device 125 and the latch 210 to ensure that the output from the comparator 225 is sampled only when the current measurement 215 corresponds to the threshold signal 220 (for example, when current should be flowing via the pulsed current driver device 115).

The output from the comparator 225 may be fed to the latch 210 only when the control signal through the filter 205 is valid. For example, a clock signal may be utilized which is derived from the control signal through the filter 205. As described above, the comparator 225 may compare the current measurement 215 against the threshold signal 220.

In one example, the threshold signal 220 may provide a range that may be satisfied by the current measurement 215. In another example, the threshold signal 220 may be a minimum current that is required to pass through the light string 110 for the desired intensity. Thus, from the signals received by the latch 210, when the current measurement 215 for the current flowing through the light string 110 is less than (or outside the desired range of) the threshold signal 220, the output 230 of the latch 210 may change state to indicate that a full or partial failure has occurred and the current through the light string 110 does not correspond to the desired current as indicated by the threshold signal 220. However, when the current measurement 215 is above the threshold or within the range of the threshold signal 220, the output 230 of the latch 210 may be maintained to indicate that the light string 110 is operating within acceptable parameters.

The output 230 from the latch 210 may be a binary output. Specifically, when the signals to the latch 210 do not cause a change in state of the latch 210, the output 230 may be a first value. The first value may be indicative of a good health indicator (e.g. "0" or "YES"). Accordingly, when a further electronic component receives the first value, a graphical representation may be generated to indicate that the light string 110 and the pulsed current driver device 115 are operating properly. However, when the signals to the latch 210 cause a change in state of the latch 210, the output 230 may be a second value. The second value may be indicative of a poor health indicator (e.g., "1"). Accordingly, when a further electronic component receives the second value, a graphical representation or alert may be generated to indicate that the light string 110 and the pulsed current driver device 115 are not operating properly. In fact, when multiple light strings are present, the further electronic component may receive outputs 230 from a plurality of implementations 200. The further electronic component may determine an identity for each light string and report on the health status of each.

In a more detailed description of the signals and outputs of the implementation 200, the system 100 may utilize a first signal from the current sensor device 120 and a second signal from the controller device 125. As noted above, the first signal may be from the current sensor device 120 which is a current measurement of a current passing through the light string 110. The second signal may be from the controller device 125 which is an indication of a setting for the pulsed current driver device 115 to control the amount of current to pass through the light string 110 to achieve a desired intensity. In generating the respective signals, the configuration of the system 100 may enable the signals from the current sensor device 120 and the controller device 125 to be forwarded to the necessary components. Specifically, the first signal may be passed to the comparator 225 as the current measurement 215. The second signal may be passed to the filter 205 and to the comparator 225 as the threshold signal 220.

The current sensor device 120 may be connected to a circuit including the power source 105, the light string 110, and the pulsed current driver device 115. Thus, the connection to the circuit may provide an input path for the current sensor device 120 such that, as described above, the current sensor device 120 may take current measurements of the circuit. The frequency with which the current sensor device 120 takes the measurements may vary based on the configuration of the current sensor device 120. The current sensor device 120 may continuously take current measurements of the circuit. Thus, in a first example, the current sensor device 120 may continuously generate the first signal indicating the current measurement 215. In a second example, the current sensor device 120 may generate the first signal indicating the current measurement 215 whenever a change in the current is detected. In a third example, the current sensor device 120 may generate the first signal at predetermined time intervals (e.g., constant time intervals, dynamic time intervals, cyclic time intervals, etc.).

It is noted that the use of a single current sensor device 120 at a terminus of the light string 110 to measure the overall current value passing through the entire light string 110 is only exemplary. For illustrative purposes, the current sensor device 120 is described in this manner. However, the exemplary embodiments may be modified to be used with a plurality of current sensor devices 120 or with one or more current sensor device 120 disposed at various other locations (e.g., output of the pulsed current driver device 115, output of the power source 105, etc.).

Once the first signal is generated, the current sensor device 120 may transmit the first signal based on the configuration of the system 100. As illustrated, the current sensor device 120 is also connected to both the controller device 125 and the detecting device 130 (e.g., the comparator 225). Thus, the connection to the controller device 125 and the detecting device 130 may provide output paths for the current sensor device 120 such that the first signal is transmitted to both of these components. Constructively, based on the implementation 200, the first signal may be passed to the comparator 225 and does not necessarily have to be passed to the controller device 125.

As described above, the controller device 125 may be configured to determine when the light string 110 is to be powered as well as determine the intensity with which the light string 110 is to be illuminated utilizing, for example, a schedule. Thus, the connection to the pulsed current driver device 115 may provide a first output path for the second signal indicating the intensity or the current that is to be passing through the circuit. In a substantially similar manner as the current sensor device 120, the controller device 125 may generate the second signal at a variety of different times. Initially, the controller device 125 may continuously monitor the schedule to determine the intensity of the light string 110. Thus, in a first example, the controller device 125 may continuously generate the second signal indicating the intensity to be used for the light string 110. In a second example, the controller device 125 may generate the second signal indicating the intensity to be used whenever a change to the intensity is indicated in the schedule. Specifically, the schedule may define time durations and respective intensities for each time duration. By tracking the passage of time, the controller device 125 may determine the point in the schedule for the light string 110 and identify the corresponding intensity. If a change to the intensity is to occur from an immediately previous intensity setting, the controller device 125 may generate the second signal. In a third example, the controller device 125 may generate the second signal at predetermined time intervals in addition to or including at times when a change in the intensity is to occur (e.g., constant time intervals, dynamic time intervals, cyclic time intervals, etc.).

Once the second signal is generated, the controller device 125 may transmit the second signal based on the configuration of the system 100. As already noted above, the controller device 125 is connected to the pulsed current driver device 115. Thus, the second signal may be transmitted to the pulsed current driver device 115 so that the pulsed current driver device 115 may set the current for the light string 110. The controller device 125 is also connected to the detecting device 130. Thus, the second signal may also be provided to the detecting device 130 (e.g., the comparator 225 and the filter 205).

As described above, the connection between the current sensor device 120 and the controller device 125 may provide an input path for the first signal to be received by the controller device 125. The first signal may be a feedback signal. Specifically, the controller device 125 may receive the current measurement to determine the current that is being passed through the circuit. Using the information of the first signal, the controller device 125 may determine whether the second signal is to be generated and transmitted if a change in the intensity of the illumination having a higher or lower current is to be used (e.g., based on the schedule).

As described above, the detecting device 130 may utilize an expected state of the light string 110 from the input of the threshold signal 220 from the controller device 125. Specifically, the expected state of the light string 110 may relate to the desired intensity of illumination to be used by the light string 110 or the current intended to be passed through the light string 110. Since the light string 110 is dimmable and may utilize any number of intensities, the second signal may be received to determine the intended current that is to be passed through the light string 110. In this manner, the expected state may be used as a first consideration to determine the health status of the light string 110. The detecting device may also determine the health status of the light string 110. By receiving the expected state as the threshold signal 220 for a first consideration, an expected current that should pass through the light string 110 may be determined. Specifically, the comparator 225 may perform a comparison operation in which two inputs (the current measurement 215 and the threshold signal 220) are compared to determine a discrepancy to generate one output (that is passed to the latch 310).

According to a first exemplary embodiment, the implementation 200 may utilize any threshold signal 220 as an input for the comparator 225. For example, the threshold signal 220 from the controller device 125 may correspond the current that should be passing through the light string 110. Thus, any expected state and any intended intensity (or current) may be used by the comparator 225. As the implementation 200 provides the appropriate timing mechanism for the comparator 225 to receive the inputs of the current measurement 215 and the threshold signal 220 for purposes of the comparison functionality, the comparator 325 may be ensured to compare the current 315 only with the correct corresponding threshold 320.

According to a second exemplary embodiment, the implementation 200 may utilize only a specific expected state. With the light string 110 being dimmable and utilizing various intensity settings, the implementation 200 may utilize only an expected state with a highest current or maximum intensity with the light string 110 being fully illuminated. Accordingly, the implementation 200 may determine whether the expected state based on the second signal from the controller device 125 is the selected expected state. In this manner, a single expected current may be used by the comparator 225. It should be noted that the selected expected state being associated with the highest current is only exemplary. That is, the comparator 225 may utilize a different selected expected state having a lower current or intensity. However, the selected expected state being associated with the highest current may provide a determination of a health status that has a highest likelihood of being correct or minimizing a probably of generating a false positive.

It should be noted that the threshold signal 220 may be set with a buffer or the comparator 225 may utilize a buffer for the comparison functionality between the expected current and the current measurement. For example, the expected current may be calculated as a single value but may be utilized as a range. As the light string 110 and the pulsed current driver device 115 are utilized in a real-world application, there may be external factors that create a less optimal condition. Accordingly, the implementation 200 may incorporate such conditions and extend the expected current into a predetermined range (e.g., +/−a set amount of current from the expected current). Thus, if the implementation 200 determines that the current measurement falls within the range associated with the expected current, the implementation 200 may determine that the light string 110 and the pulsed current driver device 115 has a good health status. However, if the implementation 200 determines that the current measurement falls outside the range associated with the expected current, the implementation 200 may determine that at least one of the light string 110 and the pulsed current driver 115 has a poor health status.

As noted above, the expected state may be a selected expected state, in particular, where a maximum current/intensity is used. In view of the manner in which the implementation 200 performs its functionality, the selected expected state being associated with a maximum current may indeed provide a highest likelihood of properly determining the health status of the light string 110 and the pulsed current driver device 115. Specifically, the light string 110 and/or the pulsed current driver device 115 may be operating sub-optimally such that the amount of current that may potentially pass through the circuit is only a percentage (e.g., 50%) of the maximum current. If the implementation 200 were to use an expected state or the comparison functionality were performed when the expected current is 50% or less than the maximum current, the implementation 200 may determine that the light string 110 and the pulsed current driver device 115 have a good health status. That is, a false positive result may be determined. If the selected expected state or the comparison were only to be performed when the state is the selected expected state associated with the maximum current, the likelihood of generating a false positive result is minimized or substantially eliminated. However, it is again noted that the use of the maximum current is only exemplary. Specifically, with the implementation 200 utilizing a timing mechanism to ensure that the comparison functionality is performed for the pair of inputs at the comparator 225, any threshold signal 220 with the corresponding incoming current 315 may be used by the comparator 225.

The implementation 200 described above relates to the system 100 being a set of circuitry components. However, the system 100 may also be implemented in a variety of other ways. For example, the system 100 may include more complex components, particularly if the determined health status may be used to further identify a malfunction between the light string 110 or the current device 120, identify a light in the light string 110, or identify a section of the light string 110 that is not operating properly. In another exemplary embodiment of the system 100, the detecting device 130 may be a computing component to which the other components of the system 100 are connected. For example, the detecting device 130 may be an electronic device connected to the current sensor device 120 and the controller device 125. The detecting device 130 may generate the output indicating whether the light string 110 is operating properly or at least one component along the path of illuminating the light string 110 is not operating properly. In such an embodiment, the detecting device 130 may include a processor, a memory arrangement, transceiver, and other components.

In performing the comparison functionality, the processor may be configured to utilize a setting application that determines the expected state of the light string 110. The processor may also utilize a comparison application that determines the health status of the light string 110. Accordingly, the functionalities of the setting application and the comparison application may correspond to the functionalities descried above for the implementation 200. However, since the detecting device 130 may utilize more complex operations, this exemplary embodiment may incorporate enhanced features. For example, when more than one current sensor device 120 is utilized with the light string 110, the output from any comparison may be used to identify the health status for the components. In a specific example, if there is a first current sensor device 120 at a midpoint of the light string 110 and a second current sensor 120 at an end of the light string 110, a comparison from the current measured at the first current sensor device 120 may indicate a health status for the first half of the light string 110 whereas the current measured at the second current sensor device 120 may indicate a health status for the second half of the light string 110. The detecting device 130 may utilize intricate timing mechanisms to ensure that the current being used for the comparison corresponds to the correct threshold. The detecting device 130 may also accurately utilize any threshold by tracking the schedule as well as combining other operations that may not be capable through circuitry components.

It should be noted that the setting application and the comparison application being described as an application (e.g., a program) executed by the processor is only exemplary. The functionality associated with the applications may also be represented as components of one or more multi-functional programs, a separate incorporated component of the detecting device, or may be a modular component coupled to the detecting device, e.g., an integrated circuit with or without firmware.

Figure 3:
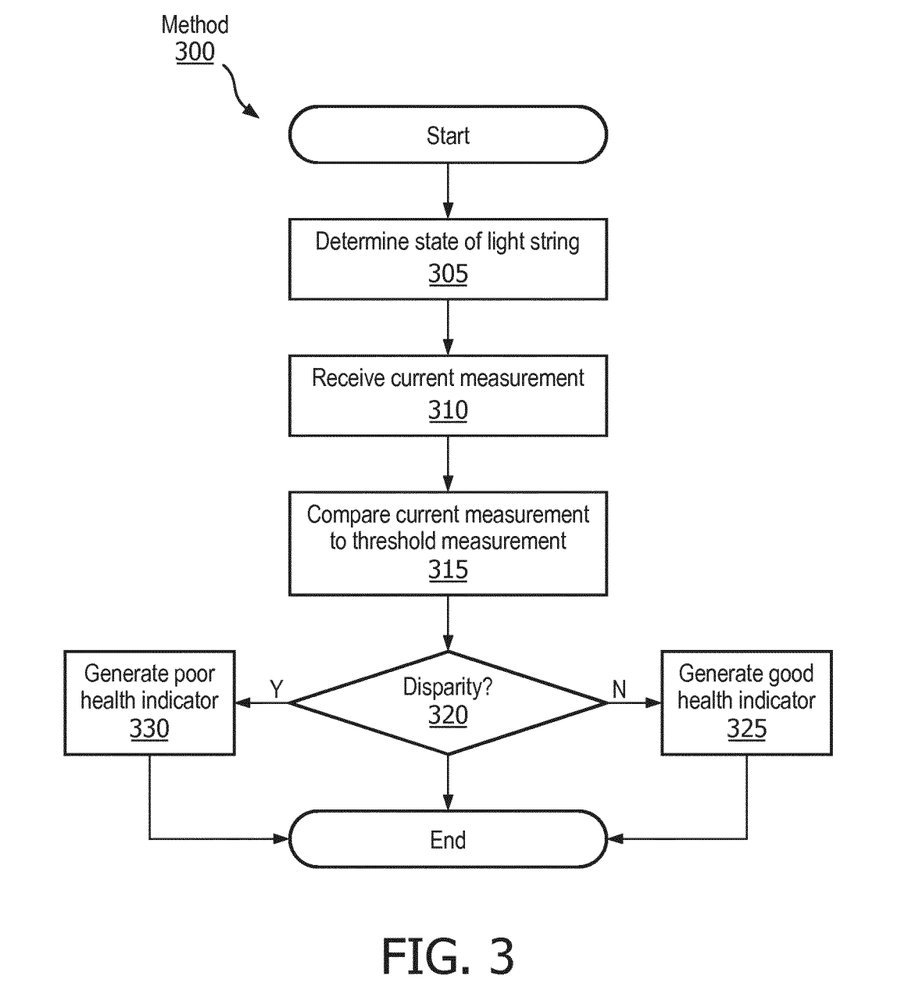
FIG. 3 shows a method for determining a health status of a light string according to the exemplary embodiments.

FIG. 3 shows a method 300 for determining a health status of the light string 110 according to the exemplary embodiments. Specifically, the method 300 may relate to the mechanism of the exemplary embodiments in which the state of the light string 110 is first determined to then utilize a corresponding current measurement at the proper time which is used in determining the health status of the light string 110. The method 300 will be described from the perspective of the implementation 200 in which the components of the system 100 are circuitry units. The method 300 will also be described with regard to the system 100 of FIG. 1.

In step 305, the controller device 125 determines a state of the light string 110. Specifically, the controller device 125 may determine the state of the light string 110 based on the schedule on which the light string 110 is illuminated. Thus, the state of the light string 110 may be determined based on the instruction from the controller device 125. Specifically, the instruction may correspond to the threshold measurement 220 which may be a minimum current value or range of current values that are expected to be passing through the light string 110 since the second signal instructs the pulsed current driver device 115 to allow the current corresponding to the second signal to pass through the light string 110 to achieve an intensity for the light string 110 to be illuminated.

The controller device 125 may instruct the pulsed current driver device 115 to illuminate the light string 110 in a variety of different intensities. For example, the light string 110 may be unpowered (e.g., no current passing through the light string 110), fully illuminated (e.g., a maximum current passing through the light string 110), or partially illuminated (e.g., a non-zero portion of the maximum current passing through the light string 110). The state of the light string may therefore correspond to the expected state or current that is passing through the light string 110. That is, the state may correspond to the threshold 220 which is an input for the comparator 325.

In step 310, the comparator 225 may receive a current measurement. Specifically, the first signal from the current sensor device 120 may be received. In a particular embodiment, the current measurement 215 may continuously be monitored until the selected expected state is determined (e.g., the clock signal is valid). When the selected expected state is determined, the current measurement 215 corresponding to when this determination is made may be used.

In step 315, the comparator 225 compares the current measurement 215 to the threshold measurement 220. As described above, the threshold measurement 220 may be a minimum current or range of currents that indicates when the light string 110 is expected to be in the selected expected state. Since the timing of when the current measurement 215 is received corresponds to when the light string 110 is expected to be in the selected expected state, the comparison functionality may be performed in an accurate manner.

In step 220, the comparator 225 determines whether there is a disparity between the current measurement 215 and the threshold measurement 220. As noted above, the threshold measurement 220 may not be a singular value but may encompass one or more values as a minimum or a range. Thus, the detecting device 130 may determine when a disparity is present when the current measurement 215 is outside the allowed values associated with the threshold measurement 220.

When there is no disparity, the implementation 200 may continue the method 300 to step 325 in which a good health indicator is generated. Specifically, the output 230 may be a binary health indicator in which the circuit including the light string 110 and the pulsed current driver device 115 is determined to be operating as expected or not. In a particular embodiment, the implementation 200 may utilize the latch 210 which remains in an existing state to indicate the good health indicator by using the same output 230. However, when there is a disparity, the implementation 200 may continue the method 300 to step 330 in which a poor health indicator is generated. In the particular embodiment, the latch 210 may change state to indicate the poor health indicator by updating the output 230.

The method 300 described above may relate to when any threshold 320 is utilized to compare to the correctly timed current measurement 315. However, if the method 300 were to only use a selected threshold 320 (e.g., a maximum current/intensity), the method 300 may include a further step. For example, after step 305, the method 300 may determine whether the light string 110 is in the selected expected state. As described above, the implementation 200 may utilize a selected expected state. For example, the selected expected state may be when the pulsed current driver device 115 is instructed by the second signal from the controller device 125 to illuminate the light string 110 with the maximum current or maximum intensity. The selected expected state may have an expected current associated therewith. If the state of the light string 110 does not correspond to the selected expected state, the implementation 200 may continue to monitor the state of the light string 110. However, if the state of the light string 110 corresponds to the selected expected state, the implementation 200 may continue the method 300 such that the comparison functionality of the detecting device 130 may be performed. For example, the second signal from the controller device 125 (after being filtered by the filter 205) may be a clock signal that is only valid when the state is the selected expected state.

The exemplary embodiments provide a device, system, and method of generating a health indicator for a circuit including a light string and a pulsed current driver device. The health indicator may be a binary health indicator indicating whether the circuit is operating as expected or if at least one component in the circuit is partially or fully failing. The health indicator may be generated by determining an expected state of the circuit, identifying an expected current for the expected state, measuring a current through the circuit, and comparing the current measurement to the expected current. By ensuring the timing that the current measurement is taken at the correct time, a disparity in the comparison may be indicative of a partial or total failure of the circuit.

Those skilled in the art will understand that the above-described exemplary embodiments may be implemented in any suitable software or hardware configuration or combination thereof. In a further example, the exemplary embodiments of the above described method may be embodied as a computer program product containing lines of code stored on a computer readable storage medium that may be executed on a processor or microprocessor. The storage medium may be, for example, a local or remote data repository compatible or formatted for use with the above noted operating systems using any storage operation.

It will be apparent to those skilled in the art that various modifications may be made in the present disclosure, without departing from the spirit or the scope of the disclosure. Thus, it is intended that the present disclosure cover modifications and variations of this disclosure provided they come within the scope of the appended claims and their equivalent.

The invention claimed is:

1. A system, comprising:
   a circuit including a control device, an LED light string and a pulsed current driver of the LED light string, the circuit connected to a power source;
   a current sensor measuring a current through the circuit; and
   a detecting device determining an ON or OFF pulsed current state of the circuit, the detecting device receiving, from the control device an expected current expected to be passing through the circuit based on an intensity of the LED light string, the expected current associated with the ON pulsed current state, the detecting device receiving a current measurement from the current sensor during a time when the circuit is in the ON pulsed current state, the detecting device determining a comparison between the current measurement and the expected current when the circuit is in an ON pulsed current state, the detecting device generating an output indicative of a health status of the circuit based on the comparison; and
   wherein the expected current is adjusted using an adjustable voltage circuit.

2. The system of claim 1, wherein the ON or OFF pulsed current state is determined based on a control signal from the control device, the control signal instructing the pulsed current driver to enable the expected current to pass through the circuit.

3. The system of claim 1, wherein the current is determined based on a measurement signal from the current sensor.

4. The system of claim 3, wherein the measurement signal is one of an analog voltage and a digital readout.

5. The system of claim 1, wherein the adjustable voltage circuit utilizes a digital to analog converter output of a microcontroller.

6. The system of claim 1, wherein the expected current is one of a minimum current and a range of currents.

7. The system of claim 1, wherein the light string includes at least one lighting component.

8. A method, comprising:
   providing an ON or OFF pulsed current state of a circuit including a control device, an LED light string and a pulsed current driver of the LED light string;
   receiving, from the control device, an expected current expected to be passing through the circuit based on an intensity of the LED light string, the expected current associated with the ON pulsed current state;
   measuring a current through the circuit during a time when the circuit is in the ON pulsed current state;
   determining a comparison between the current and the expected current when the circuit is in an ON pulsed current state; and
   generating an output indicative of a health status of the circuit based on the comparison; and
   wherein the expected current is adjusted using an adjustable voltage circuit.

9. The method of claim 8, wherein the ON or OFF pulsed current state is determined based on a control signal from the control device, the control signal instructing the pulsed current driver to enable the expected current to pass through the circuit.

10. The method of claim 8, wherein the current is determined based on a measurement signal from a current sensor.

11. The method of claim 10, wherein the measurement signal is one of an analog voltage and a digital readout.

12. The method of claim 8, wherein the adjustable voltage circuit utilizes a digital to analog converter output of a microcontroller.

13. The method of claim 8, wherein the expected current is one of a minimum current and a range of currents.

* * * * *